United States Patent [19]
Tanimoto et al.

[11] Patent Number: 5,933,731
[45] Date of Patent: Aug. 3, 1999

[54] SEMICONDUCTOR DEVICE HAVING GATE OXIDE FILMS HAVING DIFFERENT THICKNESSES AND MANUFACTURING METHOD THEREOF

[75] Inventors: Masao Tanimoto, Yokohama; Norihisa Arai, Omiya, both of Japan

[73] Assignee: Kabushiki Kaisha Toshiba, Kawasaki, Japan

[21] Appl. No.: 08/823,979

[22] Filed: Mar. 25, 1997

Related U.S. Application Data

[62] Division of application No. 08/521,723, Aug. 31, 1995, abandoned.

[30] Foreign Application Priority Data

Sep. 1, 1994 [JP] Japan ................................. 6-208722

[51] Int. Cl.⁶ ................................................. H01L 21/336
[52] U.S. Cl. ........................ 438/258; 438/778; 438/787
[58] Field of Search ................................... 257/392, 395, 257/396, 500, 501; 438/201, 258, 276, 778, 787

[56] References Cited

U.S. PATENT DOCUMENTS

| | | | |
|---|---|---|---|
| 4,378,565 | 3/1983 | Ghezzo et al. | 257/396 |
| 4,525,811 | 6/1985 | Masuoka | 257/903 |
| 4,651,406 | 3/1987 | Shimizu et al. | 438/275 |
| 5,241,208 | 8/1993 | Taguchi | 257/500 |
| 5,254,489 | 10/1993 | Nakata | 438/258 |
| 5,400,278 | 3/1995 | Kunori et al. | 257/501 |
| 5,436,495 | 7/1995 | Sakamoto | 257/501 |
| 5,472,892 | 12/1995 | Gwen et al. | 438/587 |
| 5,502,009 | 3/1996 | Lin | 438/275 |
| 5,663,084 | 9/1997 | Yi et al. | 438/453 |
| 5,712,178 | 1/1998 | Cho et al. | 438/201 |
| 5,712,201 | 1/1998 | Lee et al. | 438/239 |

*Primary Examiner*—John F. Niebling
*Assistant Examiner*—Christopher Lattin
*Attorney, Agent, or Firm*—Banner & Witcoff, Ltd.

[57] ABSTRACT

The element separation region has a section on its surface, where the first resist pattern and second resist pattern overlap with each other. The overlapping section is not etched even while removing the dummy oxide films formed in the first and second regions divided by the element separation region. Therefore, a sufficient thickness of the element separation region is kept. Further, by providing the overlapping section, the formation of sources of generating dust, namely, fine recesses and projections on the element separation region, can be prevented if an masking error occurs. Consequently, the step of removing the dust generating sources is not necessary, thereby reducing the number of manufacturing steps.

10 Claims, 6 Drawing Sheets

SEMICONDUCTOR DEVICE HAVING GATE OXIDE FILMS HAVING DIFFERENT THICKNESSES AND MANUFACTURING METHOD THEREOF

This application is a division of application Ser. No. 08/521,723 filed Aug. 31, 1995, now abandoned.

BACKGROUND OF THE INVENTION

1. Field of the Invention

The present invention relates to, for example, a MOS-type semiconductor device, and more specifically, to a semiconductor device having gate oxide films having two or more different thicknesses on the same substrate and the manufacturing method therefor.

2. Description of the Related Art

There is a great demand for MOS-type semiconductor devices because of their high densities, their high reliabilities and their high performances. Some of the MOS-type semiconductor devices use a plurality of power sources. For example, a non-volatile memory uses a high voltage of about 12V for writing and erasing data unlike for a general reading of data. Consequently, the element which constitutes a circuit for writing or erasing data should be of a high voltage-withstanding type which can withstand a high voltage. Further, a voltage of about 5V is used for a general reading of data. Therefore, the element which constitutes the reading circuit need not be a high voltage withstanding type, but the element may be of a low voltage withstanding type. Thus, a non-volatile memory has a structure in which high voltage withstanding elements and low voltage withstanding elements are mixedly provided in a single semiconductor device.

Due to the presence of the high voltage withstanding elements, there is a tendency for the thickness of the gate oxide film to increase. This is because the reliability of the gate oxide film can be maintained high by increasing the thickness of the gate oxide film so as to relax an electrical field applied to the gate oxide film. However, if the thickness of the gate oxide film is increased, the driving performance of the elements is decreased. In other words, the driving performance of the low voltage withstanding elements, which need not withstand a high voltage, is also decreased, thus creating a problem with regard to the demand for a high density and a high level of performance of the semiconductor device. In order to remove this problem, generally, a thin gate oxide film should be used for a low voltage withstanding element to which a low voltage is supplied, and a thick gate oxide film should be used only for a high voltage withstanding element to which a high voltage is conventionally supplied, so that the above adverse influence is not propagated to the low voltage withstanding elements formed within the same substrate. For this reason, an element having two types of gate oxide films within a semiconductor device, is used.

Figure 5A:
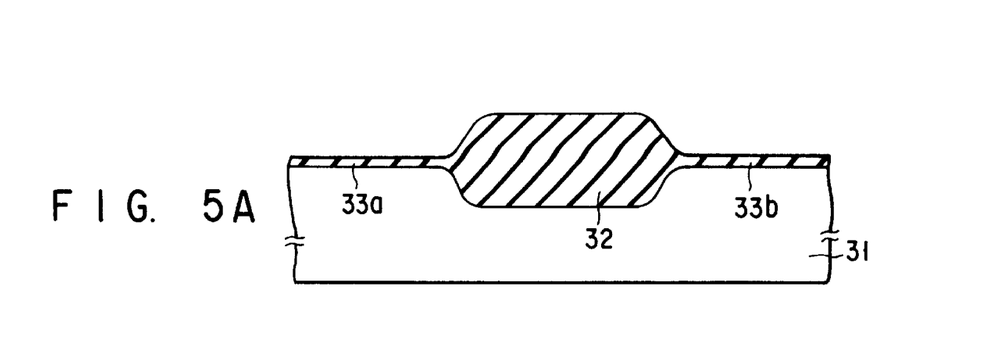
FIGS. 5A to 5C are cross sectional views illustrating steps in a conventional method of manufacturing a semiconductor device.

FIGS. 5A to 8B each illustrate a manufacturing step of forming an N-type transistor having two types of gate oxide films. First, as shown in FIG. 5A, an element separation oxide film (to be called as element separation region hereinafter) 32 is formed in a surface region of a P-type semiconductor substrate 31 by a known LOCOS (selective oxidization) method. Then, dummy oxide films 33a and 33b are formed on the surface of the semiconductor substrate 31.

Figure 5B:
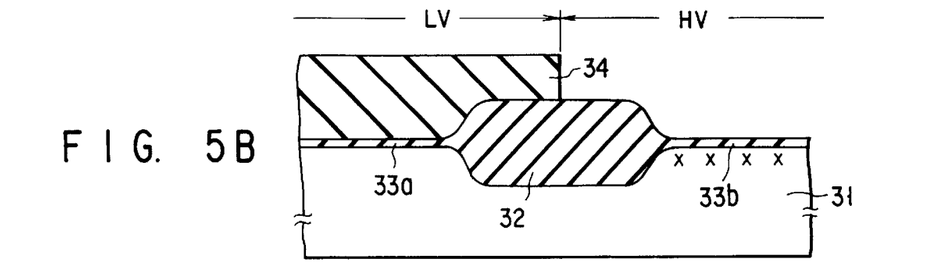

Next, as shown in FIG. 5B, a resist pattern 34 is formed on the dummy oxide film 33a and the element separation region 32. With use of the resist pattern 34 as a mask, a P-type impurity used for controlling the threshold voltage, namely, boron, is doped into a first region HV, which is supposed to be formed into an element to which a high voltage, for example, 12V, is applied.

Figure 5C:
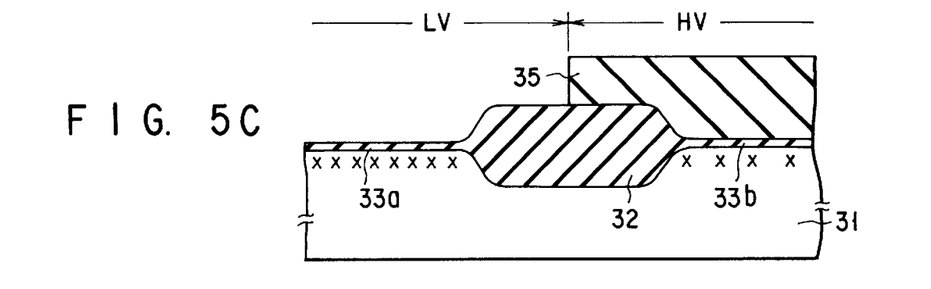

After the resist pattern 34 is removed, a resist pattern 35 is formed on the dummy oxide film 33b and the element separation region 32 as shown in FIG. 5C. With use of the resist pattern 35 as a mask, a different amount of P-type impurity, from that used for the first region HV is doped into a second region LV, which is supposed to be formed into an element to which a low voltage is applied. With this structure, a predetermined threshold voltage can be set even in the case where the thickness of the gate oxide film to be formed in the first region HV differs from that of the gate oxide film to be formed in the second region LV.

Figure 6A:
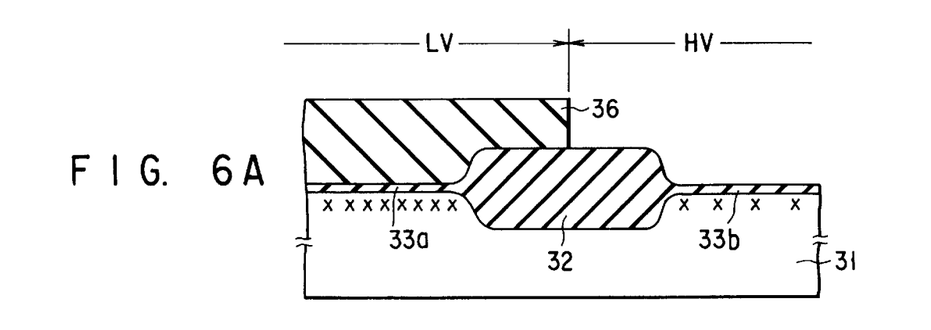
FIGS. 6A to 6C are cross sectional views illustrating steps in the method, subsequent to those of FIG. 5C.
Figure 6B:
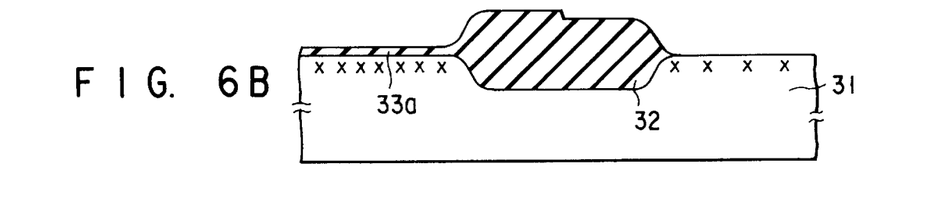
Figure 6C:
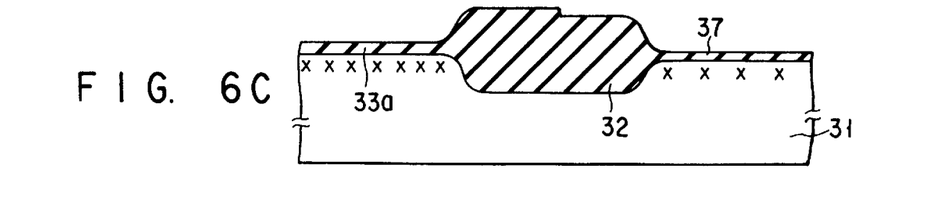

Next, as shown in FIG. 6A, after the resist pattern 35 is removed, a resist pattern 36 which corresponds to the second region LV is formed. With use of the resist pattern 36 as a mask, the dummy oxide film 33b of the first region HV is removed by etching as shown in FIG. 6B. Further, after the resist pattern 36 is removed, a thick gate oxide film 37 is formed on the portion of the semiconductor substrate 31, which corresponds to the position of the first region HV, as shown in FIG. 6C.

Figure 7A:
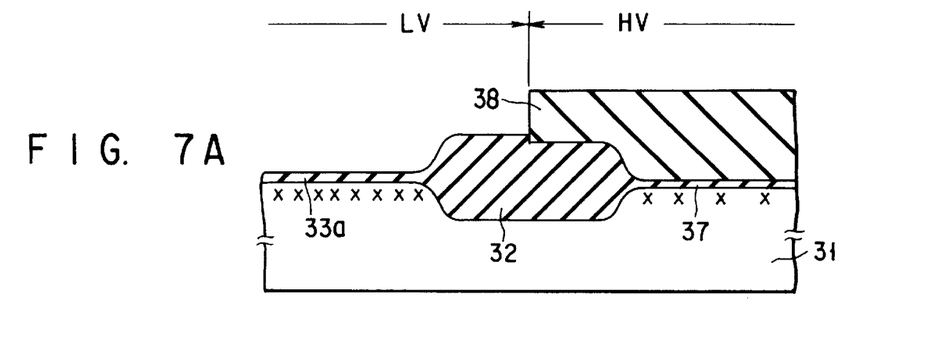
FIGS. 7A to 7C are cross sectional views illustrating steps in the method, subsequent to those of FIG. 6C.
Figure 7B:
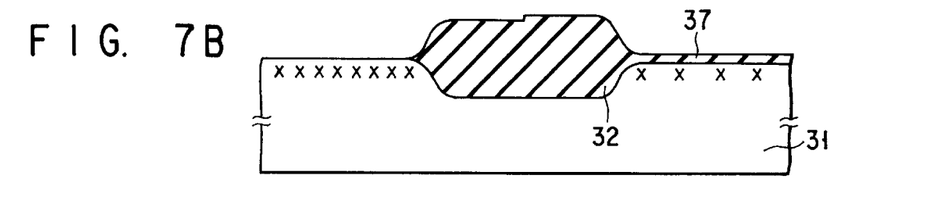
Figure 7C:
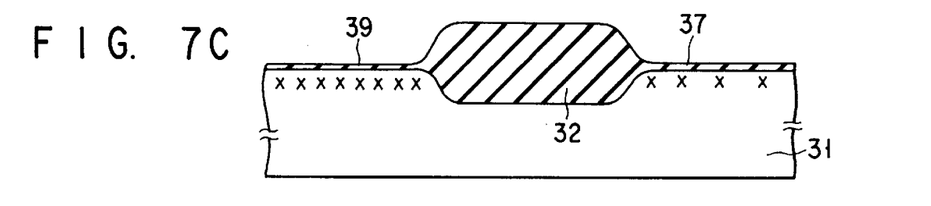

As shown in FIG. 7A, a resist pattern 38 is formed on the first region HV. With use of this pattern as a mask, the dummy oxide film 33a on the second region LV is removed by etching as shown in FIG. 7B. Further, after the resist pattern 38 is removed, a thin gate oxide film 39 is formed on the portion of the semiconductor substrate 31, which corresponds to the position of the second region LV as shown in FIG. 7C.

After the gate oxide films 37 and 39 having different thicknesses are formed as described above, a high voltage withstanding element and a low voltage withstanding element are formed in the first region HV and the second region LV, respectively, by a conventional method of manufacturing a MOS transistor.

Figure 8A:
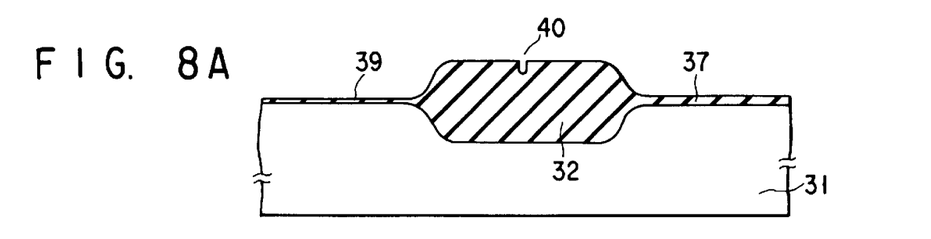
FIGS. 8A and 8B are cross sectional views each illustrating a source of generating dust.
Figure 8B:
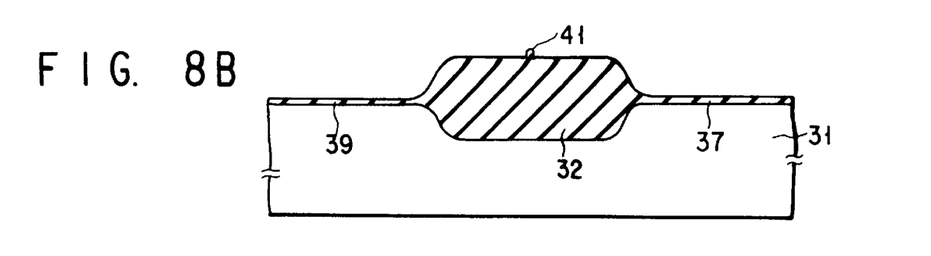

The two resist patterns 36 and 38 used for removing the dummy oxide films 33b and 33a, while forming the gate oxide films 37 and 39 having different thicknesses, are formed so that edge portions of these patterns meet with each other at the central portion of the surface of the element separation region 32. However, on the element separation region 32, the position of the mask used to form the resist pattern 36 is in some cases displaced from the position of the mask for the resist pattern 38. In such a case, a recess portion 40, for example, is formed on the element separation region 32 as shown in FIG. 8A, or a projection portion 41, for example, is formed on the element separation region 32 as shown in FIG. 8B. In the case shown in FIG. 8A, where the recess portion 40 is formed on the element separation region 32, a resist material or a gate electrode material, which is likely to serve as a source of generating dust, enters in the recess portion 40 in a later step, which lowers the yield of the products and therefore adversely affects the reliability of the products.

Further, as shown in FIG. 8B, for example, if the projection portion 41 is formed on the element separation region 32, the projection portion 41 serves as a source of generating dust. In the case where the recess portion 40 or the projection portion 41 is formed, conventionally, such an irregularity is removed by the etching process including the photolithography step, thus increasing the number of steps.

Further, in the case where the resist patterns 36 and 38 are formed, the entire surface of the element separation region 32 is etched in both steps of etching the dummy oxide film 33a. Consequently, the element separation region 32 is thinned, and the inverse withstand of the parasitic field transistor which regards the element separation region 32 as a gate insulation film, is lowered, thus deteriorating the element separating effect. Therefore, in order to assure the element separation, the width of the element separation region must be widened, which creates a problem of blocking the downsizing of the semiconductor device.

SUMMARY OF THE INVENTION

The object of the present invention is to provide a downsized semiconductor device which does not generate dust while suppressing an increase in number of manufacturing steps and in production cost, and has an improved reliability, and a method of manufacturing such a device.

The object of the present invention can be achieved by a semiconductor device comprising:

an element separation region formed on a semiconductor substrate, the element separation region separating a surface of the semiconductor substrate into a first region and a second region;

a first MOS transistor formed on the first region of the semiconductor substrate, the first MOS transistor having a first gate oxide film; and a second MOS transistor formed on the second region of the semiconductor substrate, the second MOS transistor having a second gate oxide film having a thickness different from that of the first gate oxide film;

wherein the element separation region has a projection on a surface thereof, and a length of the projection taken along the surface of the substrate, which is given by X, and distances from effective boundaries between the element separation region and the first and second regions, to the projection, which are given by L1 and L2, respectively, have relationships of $X \geq L1$ and $X \geq L2$, respectively, and a method of manufacturing a semiconductor device, comprising the steps of:

forming an element separation region on a semiconductor substrate and forming dummy oxide films on first and second regions of the semiconductor device, divided by the element separation region;

covering the second region and more than a half section of the element separation region, with a first resist pattern, and removing the dummy oxide film on the first region;

forming a first gate oxide film on the first region;

covering the first region and more than a half section of the element separation region, with a second resist pattern, and removing the dummy oxide film on the second region;

forming a second gate oxide film having a thickness different from that of the first gate oxide, on the second region;

wherein the element separation region has a section in which the first resist pattern and the second resist pattern overlap with each other.

The element separation region has a section on its surface, where the first resist pattern and second resist pattern overlap with each other. The overlapping section is not etched even while removing the dummy oxide films formed in the first and second regions divided by the element separation region. Therefore, a sufficient thickness of the element separation region is kept. Further, by providing the overlapping section, the formation of sources of generating dust, namely, fine recesses and projections on the element separation region, can be prevented if an masking error occurs. Consequently, the step of removing the dust generating sources is not necessary, thereby reducing the number of manufacturing steps, and the production cost.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENT

An embodiment of the present invention will now be described with reference to accompanying drawings.

Figure 1A:
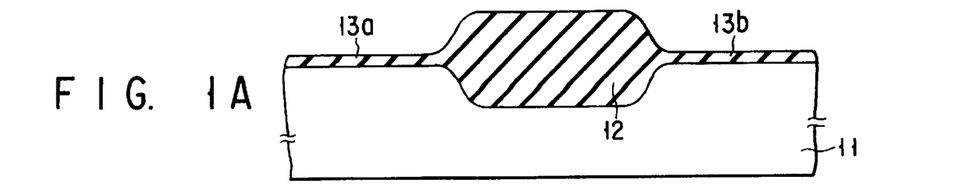
FIGS. 1A to 1C are cross sectional views illustrating steps in the method of manufacturing a semiconductor device, according to an embodiment of the present invention.

FIGS. 1A through 4C illustrate an embodiment of the present invention. In FIG. 1A, an element separation region 12 having a thickness of, for example, 600 nm is formed in a surface region of a P-type semiconductor substrate 11 by a conventional LOCOS (selective oxidization) method. After that, dummy oxide films 13a and 13b each having a thickness of, for example, 12 nm, are formed on a surface of the semiconductor substrate 11.

Figure 1B:
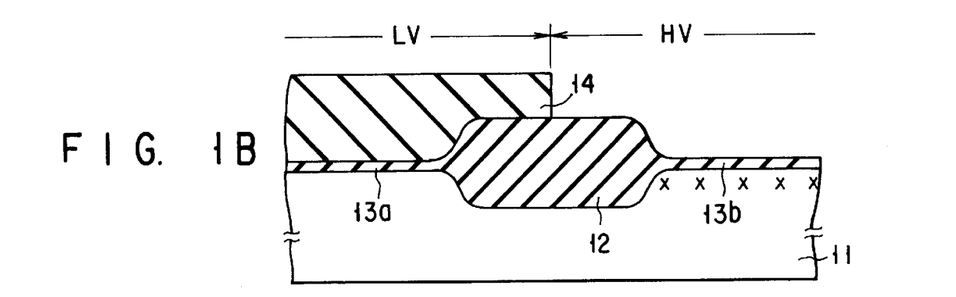

Next, as shown in FIG. 1B, a resist pattern 14 is formed on the dummy oxide film 13a and substantially a half portion of the element separation region. With use of the resist pattern 14 as a mask, a P-type impurity, namely, boron ion, is implanted at an accelerating voltage of 60 keV and a dose amount of $1 \times 10^{12}/cm^3$ into a first region HV, which is supposed to be formed into an element to which a high voltage, for example, 12V, is applied.

Figure 1C:
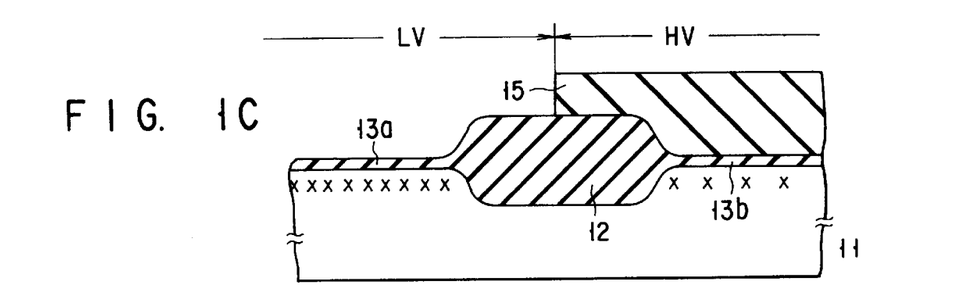

Next, as shown in FIG. 1C, after removing the resist pattern 14, a resist pattern 15 is formed on the dummy oxide film 13b and substantially a half portion of the element separation region 12. With use of the resist pattern 15 as a mask, a P-type impurity, namely, boron ion, is implanted in a greater amount than that of the first region HV, at an accelerating voltage of 60 keV and a dose amount of $4 \times 10^{12}/cm^3$ into a second region LV, which is supposed to be formed into an element to which a low voltage is applied.

Figure 2A:
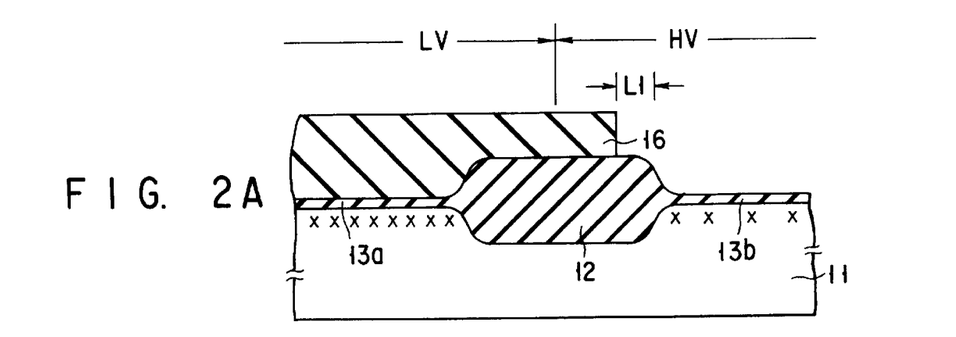
FIGS. 2A to 2C are cross sectional views illustrating steps in the method, subsequent to those of FIG. 1C.
Figure 2B:
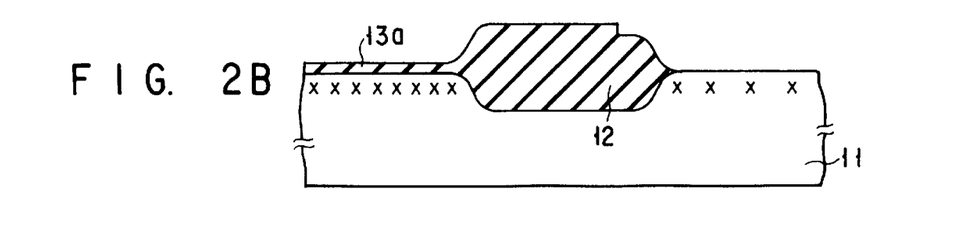
Figure 2C:
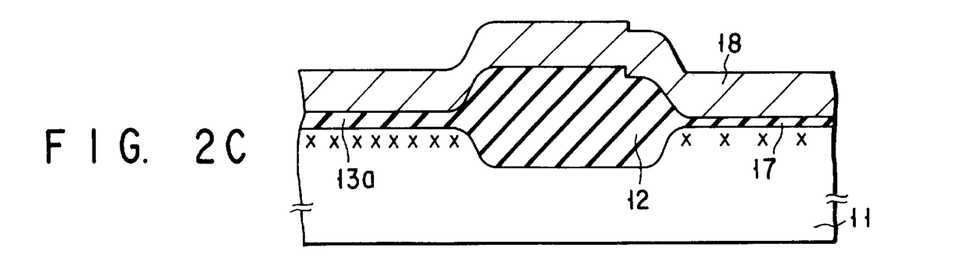

Next, as shown in FIG. 2A, after removing the resist pattern 15, a resist pattern 16 is formed on the dummy oxide film 13a and more than a half portion of the element separation region 12. An edge portion of the resist pattern 16 is set at a position located a distance L1 away from, for example, an effective boundary between the element separation region 12 and the dummy oxide film 13b. With use of the resist pattern 16 as a mask, the dummy oxide film 13b of the first region HV is removed by etching as shown in FIG. 2B. Subsequently, after the resist pattern 16 is removed, a gate oxide film 17 having a thickness of 40 nm is formed on the portion of the semiconductor substrate 11 by thermal oxidation, which is located in the first region HV as shown in FIG. 2C. After that, a polysilicon layer 18 having a thickness of 100 nm is deposited on the entire surface of the semiconductor substrate 11 by a well-known low pressure chemical vapor deposition method (LPCVD).

Figure 3A:
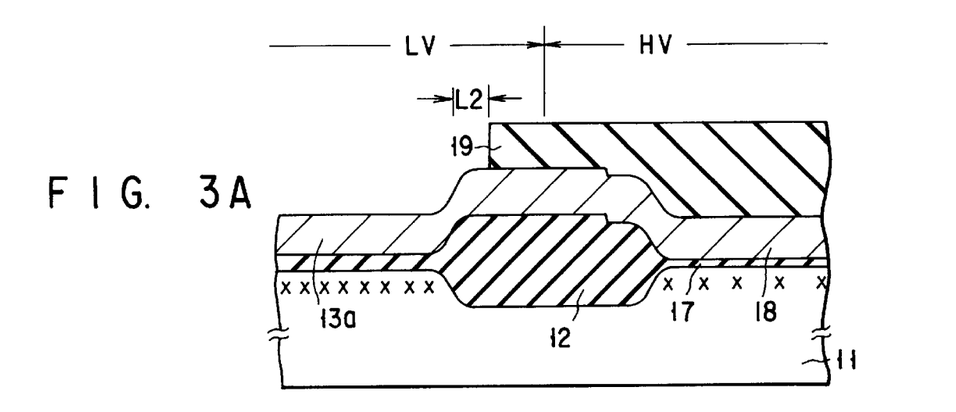
FIGS. 3A to 3C are cross sectional views illustrating steps in the method, subsequent to those of FIG. 2C.
Figure 3B:
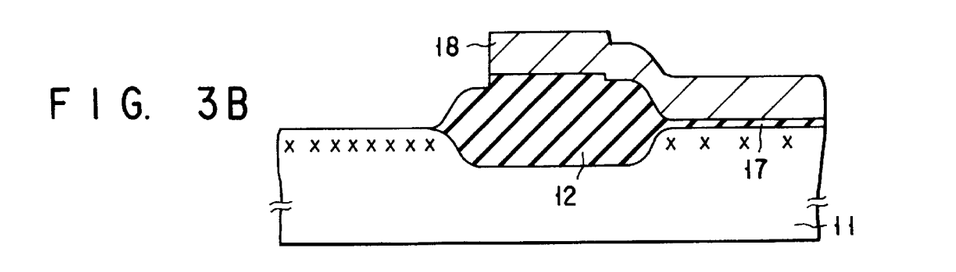
Figure 3C:
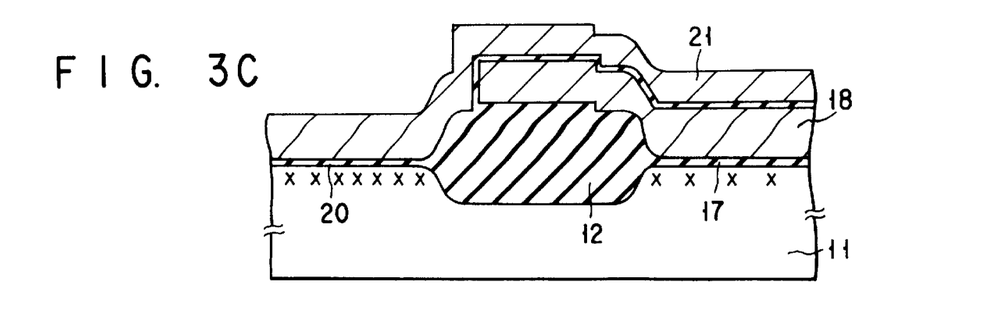

Next, as shown in FIG. 3A, a resist pattern 19 is formed on the portion of the polysilicon layer 18, which is located in the first region HV, and on more than a half of the element separation region 12. The resist pattern 19 overlaps with the resist pattern 16 on the element separation region 12. In other words, the edge portion of the resist pattern 19 is set at a position located a distance L2 away from, for example, an effective boundary between the element separation region 12 and the dummy oxide film 13a. With use of the resist pattern 19 as a mask, the portion of the polysilicon layer 18, which is located on the second region LV side, and the dummy oxide film 13a are removed by etching as shown in FIG. 3B. Subsequently, a gate oxide film 20 is formed on the portion of the semiconductor substrate 11, which is located in the second region LV by a thermal process, as shown in FIG. 3C. At the same time, a silicon oxide film is formed on the polysilicon layer 18 in a similar manner. The thickness of the gate oxide film 20 is 10 nm, and is less than that of the gate oxide film 17. Subsequently, a polysilicon layer 21 having a thickness of 100 nm is deposited on the entire surface of the semiconductor substrate 11 by the LPCVD method.

Figure 4A:
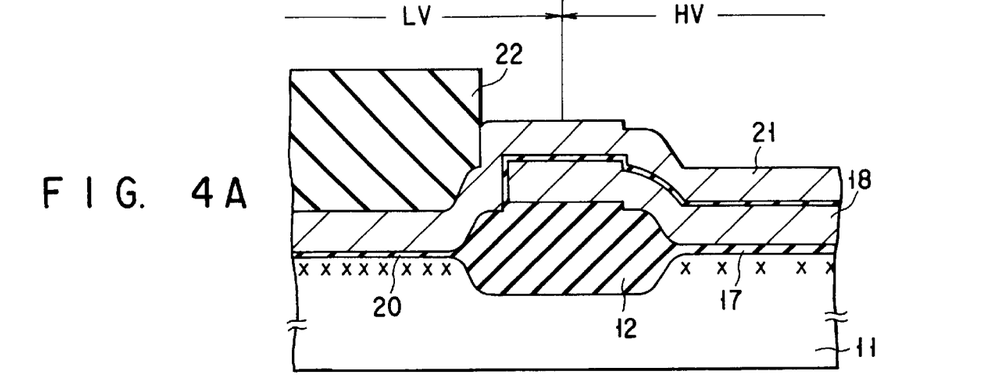
FIGS. 4A to 4C are cross sectional views illustrating steps in the method, subsequent to those of FIG. 3C.
Figure 4B:
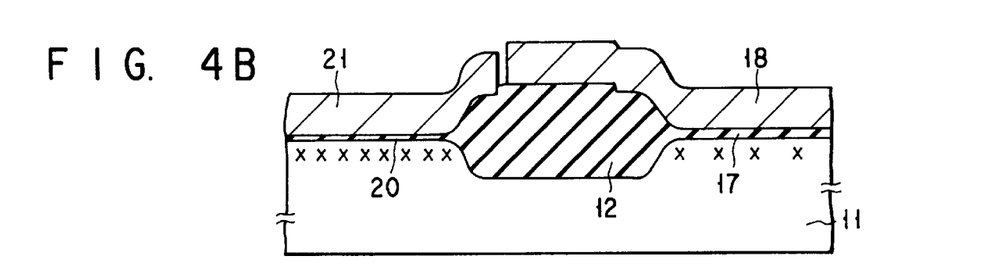

Then, as shown in FIG. 4A, a resist pattern 22 is formed on the portion of the polysilicon layer 21 which is located in the second region LV. The edge portion of the resist pattern 22 is situated close to the edge portion of the polysilicon layer 18. With use of the resist pattern 22, the polysilicon layer 21 and the silicon oxide film formed on the polysilicon layer 18 are removed by etching as shown in FIG. 4B, so as to equalize the thickness of the polysilicon layer 21 located in the second region LV and that of the polysilicon layer 18 located in the first region HV, with each other. Then, the resultant is subjected to a thermal process in a gas containing phosphor at 800° C. for 20 minutes, thus forming the polysilicon layer 18 and the polysilicon layer 21 both of which contain an N-type impurity, namely, phosphor.

Figure 4C:
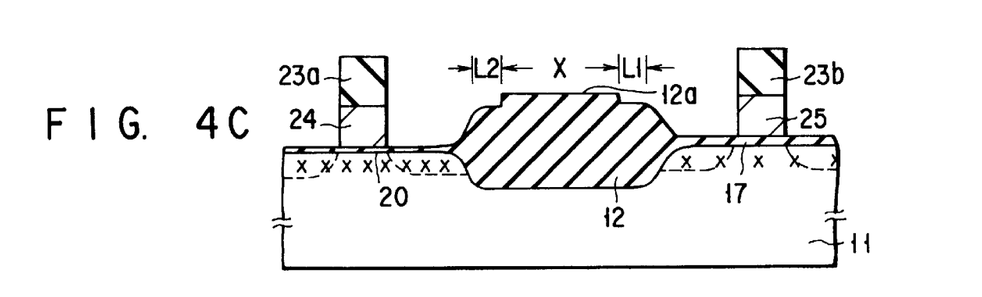

Next, as shown in FIG. 4C, resist patterns 23a and 23b are formed in predetermined sections of the second and first regions LV and HV, respectively. With use of these resist patterns as masks, the polysilicon layer 21 and the polysilicon layer 18 are removed by etching, thus forming gate electrodes 24 and 25. With use of the gate electrodes 24 and 25 as masks, ions are implanted into the semiconductor substrate 11. After that, via an annealing process, source and drain regions (not shown) are formed within the semiconductor substrate 11 at positions corresponding to the gate electrodes 24 and 25. Subsequently, after a step of forming an Al wiring layer, a passivation film and the like by a known technique, a non-volatile memory containing a high voltage withstanding MOS transistor having a thick gate oxide film 17 and a low voltage withstanding MOS transistor having a thin gate oxide film 20, is completed.

The etching process which uses the resist patterns 16 and 19 exhibits the result as shown in FIG. 4C. That is, in the case where the length of a projection portion 12a formed on the surface of the element separation region 12 (the length of the region in which the resist pattern 16 and the resist pattern 19 overlap with each other) is given by X, the relationships between the length X and the distances L1 and L2, which are defined between the effective boundary between the element separation region 12 and the first and second region HV and LV, respectively, and the projection portion 12a, are set to X≧L1, X≧L2, respectively. When these relationships are satisfied, the effective thickness of the element separation region 12 is sufficiently maintained.

According to the above-described embodiment, when forming the two types of gate oxide films, the resist patterns 16 and 19 are placed to overlap with each other; therefore the surface of the element separation region 12 is not etched in its entirety. In particular, the central portion of the element separation region 12 is protected from being etched. Consequently, fine recess portions or projection portions, which may serve as sources of generating dust, are not formed on the surface of the element separation region 12. Thus, the embodiment does not require a step of removing the recess portions and the projection portions, unlike in the conventional technique, thus decreasing the number of manufacturing steps and lowering the production cost.

Further, in the embodiment, only the edge portion of the element separation region 12 is slightly etched, and therefore an effective thickness of the element separation region 12 can be sufficiently obtained. For this reason, the width of the element separation region 12 need not be increased, thus making it possible to downsize the semiconductor device.

Further, a polysilicon layer is formed on the gate oxide films 17 and 20 finally formed, and a resist material is applied on the polysilicon layer. With this structure, the gate oxide films 17 and 20 are not brought into direct contact with the resist material, thus preventing the contamination of the gate oxide films 17 and 20 with heavy metals. Therefore, the gate oxide films can be made to have a high reliability.

It should be noted that the position of each of the effective boundaries between the element separation region 12 and the first and second regions HV and LV may be set appropriately in accordance with the thickness of the element separation region, the density of the impurity implanted into the semiconductor substrate, and the like.

Figure 9:
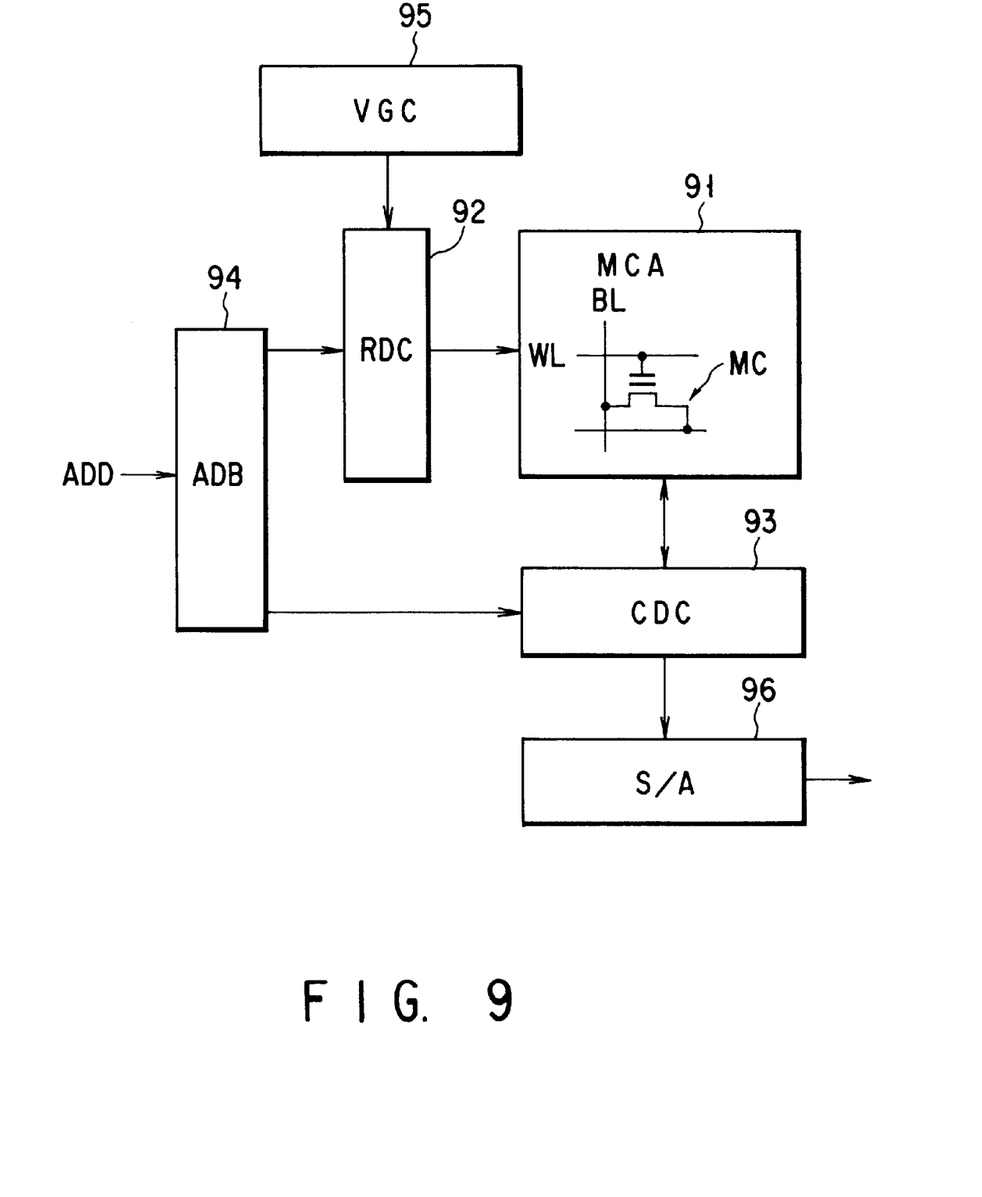
FIG. 9 is a structural diagram showing an example of a non-volatile memory device to which the present invention is applied.

FIG. 9 is an example of the non-volatile memory device to which the present invention is applied. In this non-volatile memory device, the memory cell array (MCA) 91 contains a plurality of memory cells MC each of which is constituted by, for example, an EEPROM. Each of the memory cells MC is connected to a word line WL and a bit line BL. To the memory cell array 91, a row decoder (RDC) 92 for selecting a single word line on the basis of address data and a column decoder (CDC) 93 for selecting a single bit line on the basis of address data, are connected. To the row decoder 92 and the column decoder 93, an address buffer (ADB) 94 for holding address data, is connected. To the row decoder 92, a voltage generation circuit (VGC) 95 is connected. In order to, for example, write data in a memory cell MC, or erase data stored in a memory cell therefrom, the voltage generation circuit 95 generates a predetermined high voltage, whereas in order to read data stored in a memory cell, the VGC 95 generates a predetermined read voltage. A sense amplifier (S/A) 96 is connected to the column decoder 93, and the sense amplifier 96 detects data read out from a memory cell MC, and outputs the data with amplification. Since high voltages are applied to the row decoder 92 and the voltage generation circuit 95, the gate oxide films thereof are made of thick MOS transistors, and the column decoder 93 and the sense amplifier 96 are made of MOS transistors having thin gate oxide films such as described above.

What is claimed is:

1. A method of manufacturing a semiconductor device, comprising the steps of:

forming an element separation region on a semiconductor substrate and forming dummy oxide films on first and second regions of the semiconductor device, divided by the element separation region;

covering the second region and more than a half section of the element separation region, with a first resist pattern, and removing the dummy oxide film on the first region;

forming a first gate oxide film on the first region;

covering the first region and more than a half section of the element separation region, with a second resist pattern, and removing the dummy oxide film on the second region;

forming a second gate oxide film having a thickness different from that of the first gate oxide, on the second region;

wherein the element separation region has a section in which the first resist pattern and the second resist pattern overlap with each other.

2. A method according to claim 1, further comprising the steps of:

forming a conductive layer on the first and second gate oxide films;

etching the conductive layer, and the first and second gate oxide films, thereby forming first and second gate electrodes; and introducing an impurity into sections of the semiconductor substrate, which are located at positions corresponding to the first and second gate electrodes, thereby forming first and second MOS transistors including the first and second gate electrodes.

3. A method according to claim 2, wherein the thickness of the first gate oxide film is made less than that of the second gate oxide film.

4. A method according to claim 3, wherein the first MOS transistor having the first gate oxide film is a low voltage withstanding element, and the second MOS transistor having the second gate oxide film is a high voltage withstanding element.

5. A method according to claim 1, wherein a length of the overlapping section, which is given by X, and distances from effective boundaries between the element separation region and the dummy oxide films formed in the first and second regions, to the overlapping section, which are given by L1 and L2, respectively, have relationships of $X \geq L1$ and $X \geq L2$, respectively.

6. A method according to claim 1, wherein a projection is formed at a region of the element separation region, where the first and second resist patterns overlap with each other.

7. A method of manufacturing a semiconductor device, comprising the steps of:

forming an element separation region on a semiconductor substrate and forming dummy oxide films on first and second regions of the semiconductor device, divided by the element separation region;

covering the second region and a section of the element separation region, which is defined by a distance L1 from a boundary between the element the separation region and the dummy oxide film formed in the first region, with first resist pattern, and removing the dummy oxide film on the first region;

forming a first gate oxide film on the first region;

covering the second region and a section of the element separation region, which is defined by a distance L2 from a boundary between the element separation region and the dummy oxide film formed in the second region, with a second resist pattern, and removing the dummy oxide film on the second region;

forming a second gate oxide film having a thickness different from that of the first gate oxide, on the second region;

wherein a projection having a length given by X is formed on the element separation region, and the length X of the projection, taken along the surface of the substrate, and the distances L1 and L2 have relationships of $X \geq L1$ and $X \geq L2$, respectively.

8. A method according to claim 7, further comprising the steps of:

forming a conductive layer on the first and second gate oxide films;

etching the conductive layer, and the first and second gate oxide films, thereby forming first and second gate electrodes; and introducing an impurity into sections of the semiconductor substrate, which are located at positions corresponding to the first and second gate electrodes, thereby forming first and second MOS transistors including the first and second gate electrodes.

9. A method according to claim 8, wherein the thickness of the first gate oxide film is made less than that of the second gate oxide film.

10. A method according to the claim 9, wherein the first MOS transistor having the first gate oxide film is a low voltage withstanding element, and the second MOS transistor having the second gate oxide film is a high voltage withstanding element.

* * * * *